US012719234B2

(12) United States Patent
Jacobs et al.

(10) Patent No.: US 12,719,234 B2
(45) Date of Patent: Aug. 25, 2026

(54) SEMICONDUCTOR LASER STRUCTURE FOR HIGHER-ORDER MODE SUPPRESSION

(71) Applicant: FreeSpace Photonics, Inc., Madison, WI (US)

(72) Inventors: Steven A. Jacobs, Madison, WI (US); Robert A. Marsland, Madison, WI (US)

(73) Assignee: FreeSpace Photonics, Inc., Madison, WI (US)

( * ) Notice: Subject to any disclaimer, the term of this patent is extended or adjusted under 35 U.S.C. 154(b) by 1112 days.

(21) Appl. No.: 17/727,018

(22) Filed: Apr. 22, 2022

(65) Prior Publication Data

US 2022/0344902 A1 Oct. 27, 2022

Related U.S. Application Data

(60) Provisional application No. 63/178,302, filed on Apr. 22, 2021.

(51) Int. Cl.
*H01S 5/065* (2006.01)
*H01S 5/22* (2006.01)
(Continued)

(52) U.S. Cl.
CPC .......... *H01S 5/0653* (2013.01); *H01S 5/2206* (2013.01); *H01S 5/227* (2013.01); *H01S 5/3402* (2013.01); *H01S 5/34313* (2013.01)

(58) Field of Classification Search
CPC ......... H01S 5/227; H01S 5/3401–3402; H01S 5/04253; H01S 2301/166; H01S 5/0653–0655
See application file for complete search history.

(56) References Cited

U.S. PATENT DOCUMENTS 6,301,282 B1 * 10/2001 Capasso ................. B82Y 20/00 372/46.01
6,463,088 B1 * 10/2002 Baillargeon .............. H01S 5/12 372/46.01

(Continued)

FOREIGN PATENT DOCUMENTS

DE 102016106757 A1 * 10/2016 ........... H01S 5/1003
JP 2002324943 A * 11/2002

OTHER PUBLICATIONS

Figure of SEM of the facet of an example BH QCL from A. Evans, S.R. Darvish, S. Slivken, J. Nguyen, Y. Bai, and M. Razeghi, "Buried heterostructure quantum cascade lasers with high continuous-wave wall plug efficiency", Appl. Physics. Lett., 91 (7) (2007) (Annotated).

*Primary Examiner* — Joshua King
(74) *Attorney, Agent, or Firm* — Casimir Jones, S.C.; Rick L. Abegglen; David A. Casimir

(57) ABSTRACT

A semiconductor laser including a waveguide having a core, a confinement layer to bury the core, and a metallization layer. The core includes an active core region. The confinement layer surrounds the core and includes a first confinement layer between the core and the semiconductor substrate below the core, a second confinement layer above the core, and a third confinement layer to either or both sides of the core. The metallization layer is located above the confinement layers and include a first metallization layer and a second metallization layer. The first metallization layer is in direct contact with the second confinement layer and the third confinement layer, while the second metallization layer is disposed above the first layer. The first metallization layer is tuned to have a plasmon resonance corresponding to a higher order mode with high loss.

24 Claims, 9 Drawing Sheets
(7 of 9 Drawing Sheet(s) Filed in Color)

(51) Int. Cl.

| | |
|---|---|
| ***H01S 5/227*** | (2006.01) |
| ***H01S 5/34*** | (2006.01) |
| ***H01S 5/343*** | (2006.01) |

(56) References Cited

U.S. PATENT DOCUMENTS

| | | | | |
|---|---|---|---|---|
| 6,501,783 | B1 * | 12/2002 | Capasso | H01S 5/3402 372/102 |
| 9,350,140 | B2 * | 5/2016 | Yoshinaga | H01S 5/2275 |
| 11,031,753 | B1 * | 6/2021 | Kaspi | H01S 5/0655 |
| 2005/0117618 | A1 * | 6/2005 | Tredicucci | B82Y 20/00 372/45.01 |
| 2006/0007973 | A1 * | 1/2006 | Capasso | H01S 5/06 372/45.01 |
| 2007/0280319 | A1 * | 12/2007 | Sekiguchi | H01S 5/227 372/45.01 |
| 2013/0329761 | A1 * | 12/2013 | Hashimoto | H01S 5/2219 372/45.01 |
| 2014/0254615 | A1 * | 9/2014 | Sekiguchi | H01S 5/3402 372/4 |
| 2017/0214214 | A1 * | 7/2017 | Yang | H01S 5/04253 |
| 2020/0287353 | A1 * | 9/2020 | Faist | H01S 5/3214 |

* cited by examiner

First HO

Loss (cm$^{-1}$)

Ti Thickness (nm)

Core = 4.0 um

Core = 4.5 um

Core = 5.0 um

Core = 5.5 um

Core = 6.0 um 20 18 16 14 12 10 8 6 4 2 0

0 5 10 15 20 25 30 35

10
9
8
7
6
5
4
3
2
1
0
Loss (cm$^{-1}$)
Fundamental Mode
First HO Mode
4 5 6 7 8 9
D (um)

SEMICONDUCTOR LASER STRUCTURE FOR HIGHER-ORDER MODE SUPPRESSION

CROSS-REFERENCE TO RELATED APPLICATION

This application claims priority to U.S. Provisional Application No. 63/178,302, filed on Apr. 22, 2021, the entire contents of which are hereby expressly incorporated by reference into the present application.

REFERENCE TO GOVERNMENT GRANT

This invention was developed with government support under SBIR Contract N689362000070 awarded by the U.S. Navy. The government has certain rights in the invention.

BACKGROUND OF THE INVENTION

1. Field of the Invention

The present invention relates to a semiconductor laser, such as, but not limited to, a quantum cascade laser (QCL) and a method of manufacturing the lasing structure. The semiconductor laser of the present invention provides increased power while suppressing non-desirable higher-order (HO) lateral modes that reduce beam quality.

2. Discussion of the Related Art

A quantum cascade laser (QCL) is a type of semiconductor laser formed by depositing layers of semiconductor material onto a wafer substrate. Material on both sides of a central region is etched away, leaving a central ridge. The resulting central ridge contains a core region and optical confinement layers composed of a number of stages each of which has an active region where a propagating optical field causes electrons to transition from an excited state to a ground state, emitting photons in the process. These photons amplify the optical field propagating through the core region. In order to optimize performance of the QCL, the optical field and the current flow should be confined to the core region.

Buried-heterostructure lasers (BH) utilize a buried central ridge surrounded by a semi-insulating, low refractive index material to achieve current and optical-field confinement to the ridge while maintaining a nearly planar surface, which assists with epilayer-down die attachment. FIG. 1 illustrates a one-step BH optical waveguide, as known in the prior art. In order to bury the core region 10, a regrowth process is used to surround both sides of the central ridge/core region 10. In indium phosphide (InP) based devices, an iron-doped InP (Fe:InP) layer 12 is used to surround the ridge/core region 10. The Fe:InP 12 is semi-insulating and has a lower index of refraction than the materials of the ridge/core region 10, which is needed for optical confinement. The index difference between the materials of the ridge/core region 10 and the Fe:InP 12 is much smaller than the index difference that would be obtained with an exposed central ridge. The resulting weaker optical confinement produces a wider fundamental optical mode, which increases the single-mode optical output power in the QCL. The lower index difference also reduces scattering losses associated with the roughness at the etched sidewalls of the central ridge.

Generally, the top surface of a QCL is coated with a metallization layer 14. In turn, the metallization layer 14 injects current into the ridge/core region 10. The semi-insulating layer 12 does not necessarily provide perfect current blocking over the whole area of the laser chip, which in turn can cause a shunt leakage current in the large chip areas outside the buried ridge region. For that reason, a layer 16 of a low-index insulating material such as silicon nitride ($Si_3N_4$) or silicon dioxide ($SiO_2$) is added on each side of the ridge/core region 10 to prevent this leakage. In addition, especially in BH structures without a flat-top regrown region, the semi-insulating layer 12 prevents the optical mode from being absorbed in the metallization layer 14. A short window 18 directly on top of the active region 10 is left open to the metallization layer 14 to allow current injection. The optical field in the ridge/core region 10 is prevented from being absorbed in the metallization layer 14 by the presence of several layers of low-index material, called cladding and cap layers, grown atop the core region. For example, in FIG. 1 a thick, low-index cap layer 20, such as heavily-doped InP layer 20, prevents the field from reaching the metallization layer 14. In particular, the cap layer 20 is doped more heavily than the Fe:InP regrowth 12 to lower its index of refraction, reduce field penetration, and provide good electrical contact to the metallization layer 14.

For a number of commercial applications, it is desirable to increase the output power of the semiconductor laser, such as a QCL. For example, in a free-space optical (FSO) communication system, a high-power laser may be used to achieve communication over ranges over 100 km via line-of-sight signaling to a distant receiver. Higher laser power means more signal power at the receiver. This can be accomplished by increasing the width of the laser's core region. However, as the core region increases, non-desirable HO lateral modes begin to lase. These HO modes create poor beam quality that reduces the power that may be delivered to the distant receiver. In QCLs, the HO modes can cause the peak of the laser's near-field beam profile to shift laterally as drive current changes. The laser's collimating lens translates the shifting spatial peak to a shifting pointing angle. Pulsing the laser to send digital information in this case results in a beam that sends "logic 1" in one direction and "logic 0" in a different direction, possibly causing confusion at the receiver. In addition, changes in beam quality impair the stability of the power. It is possible to eliminate the HO modes by making the core region sufficiently narrow so that the operating wavelength of the laser is above the cutoff wavelength of the HO modes. However, the narrow core region severely restricts the optical power of the laser.

As such, there is a need in the art for a semiconductor laser that suppresses the HO mode while still allowing a wider core region so that the optical power output of the laser is not compromised.

In order for a mode to lase, the optical gain provided by the active regions of the core region must overcome the optical loss of the mode caused by absorption of the waveguide materials and reflection losses at the end facets of the QCL cavity. The threshold gain of a mode is the optical gain that just overcomes these losses. When the optical gain is below the threshold gain, a mode will not lase. Generally, the threshold gain can be increased by increasing the mode loss. Thus, one way to suppress the lasing of undesirable HO modes is to increase their losses without substantially changing the loss of the desired fundamental mode.

As such, there is need in the art for a semiconductor laser that increases the loss of the HO modes without significantly increasing the loss of the fundamental mode.

SUMMARY OF THE INVENTION

The present invention is a semiconductor laser, such as, but not limited to a QCL. The inventive semiconductor laser provides increased power while suppressing non-desirable HO lateral modes that reduce beam quality when compared with quantum cascade lasers known in the prior art. The present invention pertains to a number of commercial applications, not limited to a free-space optical (FSO) communication system in which a semiconductor laser may be used to achieve communication over ranges over 100 km via line-of-sight signaling to a distant receiver.

In accordance with an embodiment of the invention, a semiconductor laser includes a structure having a central core region, a third confinement layer to bury the central core region, and a metallization layer. The central core region includes an active core region. Within the central core region there are confinement layers surrounding the active core region which includes a first confinement layer between the core and the semiconductor substrate below the core and a second confinement layer above the core. The second confinement layer above the core may also include a cap layer at the upper portion of the second confinement layer. The side confinement layer that buries the central core region surrounds it on both sides. The metallization layer is located above the confinement layers and include a first metallization layer and a second metallization layer. The first metallization layer is in direct contact with the cap layer of the second confinement layer and the third confinement layer, while the second metallization layer is disposed above the first metallization layer.

According to an aspect of the invention, the first metallization may be titanium or chromium. Meanwhile, the second metallization layer may be a plasmonic material, such as gold, silver, or aluminum. Alternative embodiments of the invention, may also include a third metallization layer between the first and second metallization layers. Further yet, the third metallization layer may be platinum.

According to another aspect of the invention, an insulating layer may be located between the metallization layer and the third confinement layer along a first portion of the third confinement layer. As a result, the first metallization layer is in direct contact with the second confinement layer and a second portion of the third confinement layer. The second portion of the third confinement layer is adjacent the second confinement layer. The second portion of the third confinement layer may extend from an edge adjacent the second confinement layer for a distance to a predisposed location. As such, the first portion of the third confinement layer may extend from the predisposed location to an end of the third confinement layer.

In accordance with another embodiment of the invention, a method of using a semiconductor laser structure first includes providing a semiconductor structure having a core, a confinement layer to bury the core, and a metallization layer. The core includes an active core region. The confinement layer surrounds the core and includes a first confinement layer between the core and the semiconductor substrate below the core, a second confinement layer above the core, and a third confinement layer to either or both sides of the core. The metallization layer is located above the confinement layers and include a first metallization layer and a second metallization layer. The first metallization layer is in direct contact with the second confinement layer and the third confinement layer, while the second metallization layer is disposed above the first layer. Next, the method includes applying a voltage across the substrate and the first metallization layer to inject electrons into the core.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

A clear conception of the advantages and features constituting the present invention, and of the construction and operation of typical mechanisms provided with the present invention, will become more readily apparent by referring to the exemplary, and therefore non-limiting, embodiments illustrated in the drawings accompanying and forming a part of this specification, wherein like reference numerals designate the same elements in the several views, and in which.

Figure 1:
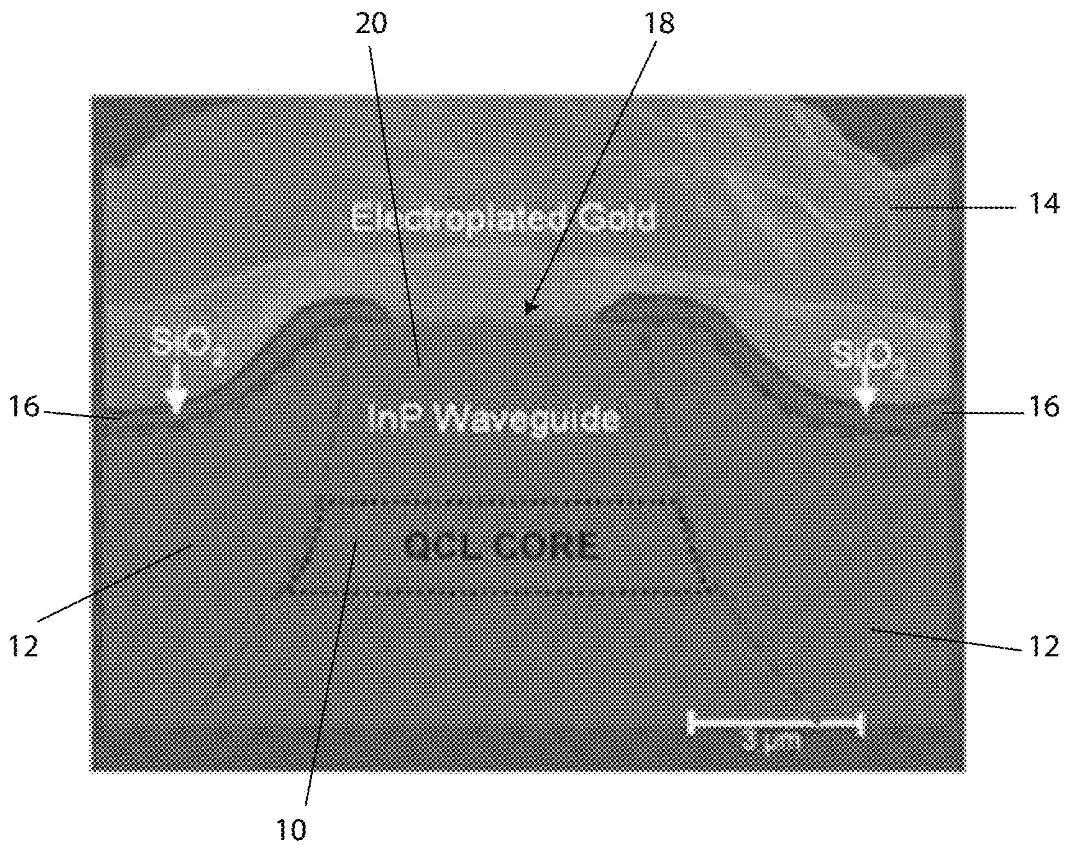
FIG. 1 is a waveguide structure of a semiconductor laser, as known in the prior art.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose.

DESCRIPTION OF PREFERRED EMBODIMENTS

The present invention and the various features and advantageous details thereof are explained more fully with reference to the non-limiting embodiments described in detail in the following description.

Figure 2A:
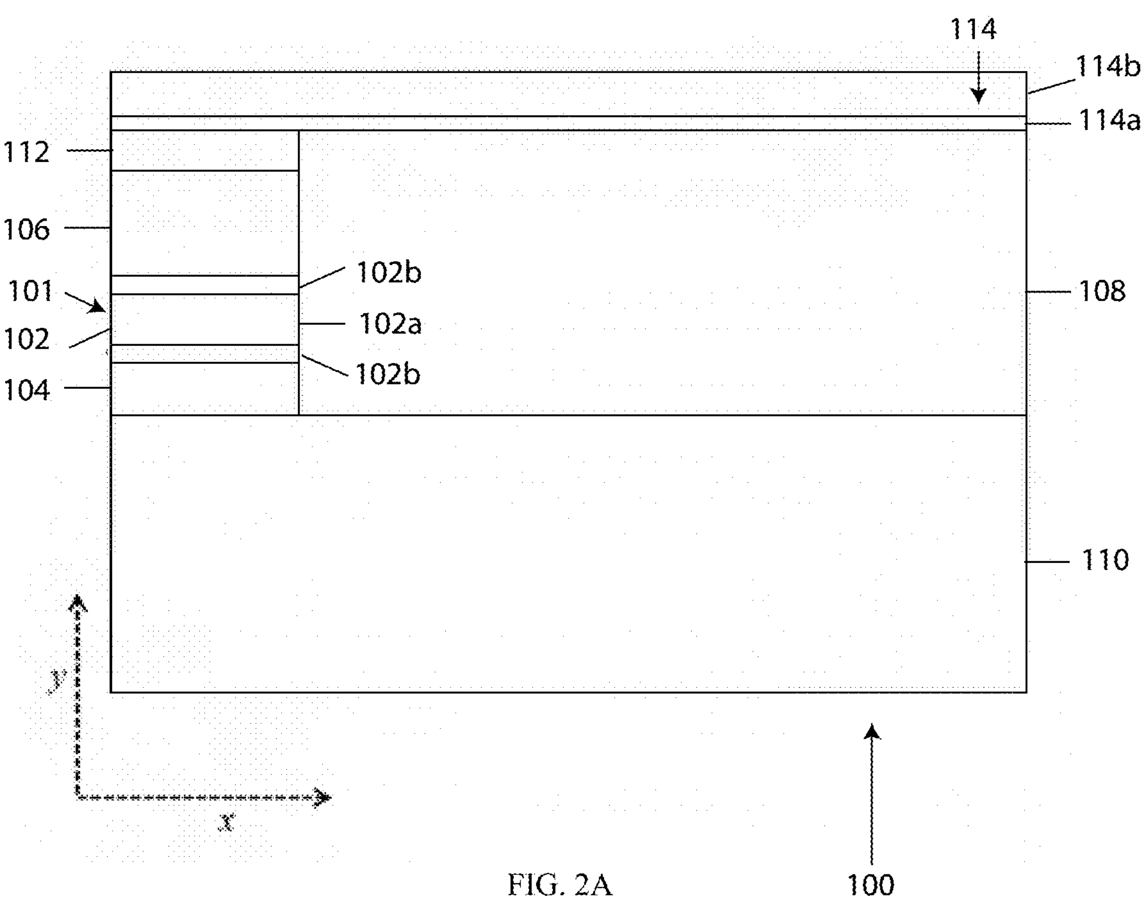
FIGS. 2A and 2B are a waveguide structure of a semiconductor laser, according to an embodiment of the invention.
Figure 2B:
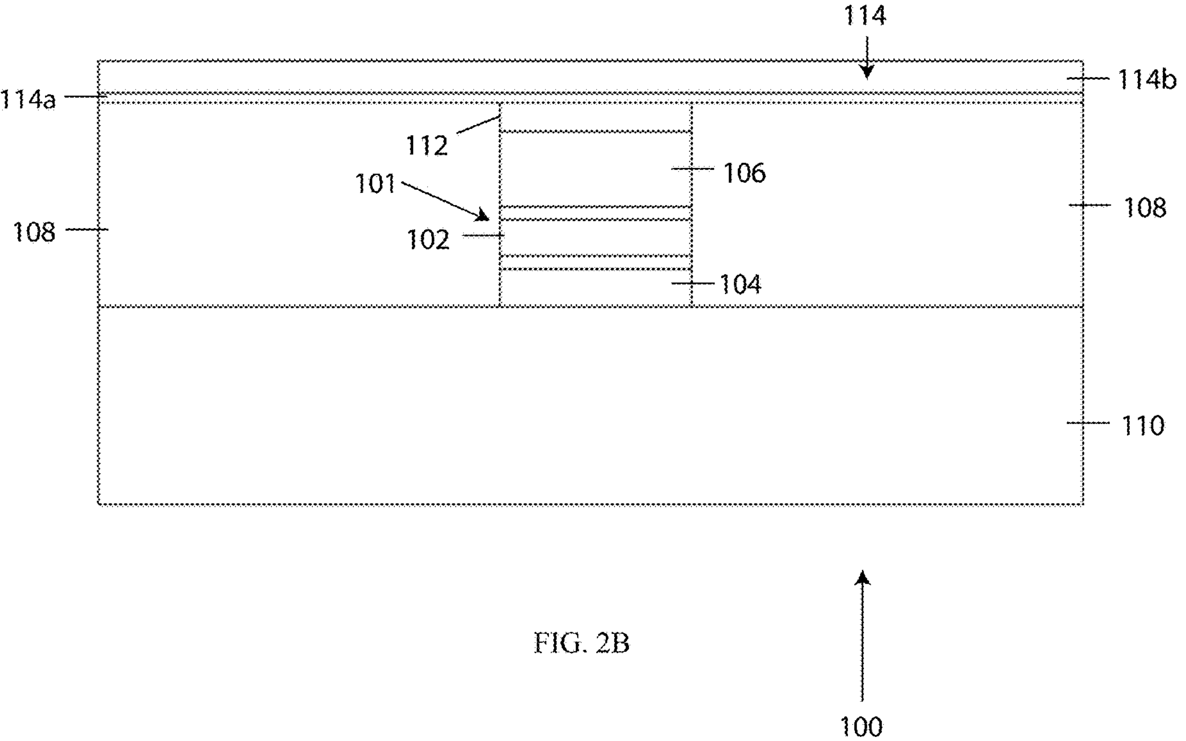

Referring to FIG. 2A, a structure 100 of a semiconductor laser is shown in accordance with an embodiment of the invention. The structure 100 is intended to support lasing of the fundamental mode at a wavelength of 4.6 μm. The layer thicknesses of the structure 100 of FIG. 2A are not drawn to scale. Further, FIG. 2A only illustrates the right half of the structure 100 (x>0). The structure 100 is symmetric in the x-coordinate. For instance, FIG. 2B represents the complete structure 100 as mirrored about the x-coordinate. The below described doping layers are preferably doped with silicon unless otherwise stated. Further, the level of doping (i.e., 2E16, 2E18, etc.) refers to the doping per $cm^3$.

As shown in FIG. 2, the structure 100 includes a central ridge 101 including an active core 102 having a main core region 102*a* with an indium gallium arsenide (InGaAs) layer 102*b* disposed on either or both of the top and bottom sides of the core region 102*a*. Within the central ridge 101, an upper confinement or cladding layer 106 is disposed on a top side of the core 102 and a lower confinement or cladding layer 104 is disposed on a bottom side of the core 102 between the core 102 and a semiconductor substrate 110. In the preferred embodiment of the invention, the lower confinement layer 104 is an InP doped layer. More preferably, the lower confinement layer 104 is an InP (2E16) doped layer.

In the preferred embodiment of the invention, the upper confinement layer 106 is an InP doped layer. More preferably, the upper confinement layer 106 is an InP (2E16) doped layer. In the representative embodiment of the invention, the upper confinement layer 106 may also include a cap layer 112 disposed at the upper portion of the upper confinement layer 106 and adjacent a metallization layer 114. Preferably, the cap layer 112 is also an InP doped layer. More preferably, the cap layer 112 is an InP (2E19) doped layer. In turn, the cap layer 112 has a lower index than the rest of the upper confinement layer 106 to prevent interaction between the metallization layer 114 and the field above the core 102.

In the representative embodiment of the invention, the central ridge 101 and core 102 are then buried by confinement or cladding layer 108, which is disposed on either side of the central ridge 101 and extends from the substrate 110 to the top of the central ridge 101 at the metallization layer 114. In the representative embodiment of the invention, the confinement layer 108 extends from the side of the core 102 to the end of the substrate 110 and may be referred to as the side confinement layer 108. Preferably, the side confinement layer 108 is an Fe:InP doped layer that confines the light and current to the core 102 and the active core region 102*a*.

Two metallization layers 114*a* and 114*b* are disposed above the upper confinement layer 106 of the central ridge 101 and the side confinement layer 108. In the representative embodiment of the invention, the first layer 114*a* is disposed directly on the upper surfaces of the upper and side confinement layers 106, 108, while the second layer 114*b* is disposed directly on the upper surface of the first layer 114*a*.

The first layer 114*a* is in direct contact with both the upper confinement layer 106 over the core 102 and the side confinement layer 108 for at least a portion of the upper surface of the side confinement layer 108. In certain embodiments (such as FIG. 2), the first layer 114*a* of the metallization layer 114 is in contact with the entire upper surface of the side confinement layer 108.

Preferably, the first layer 114*a* may be titanium (Ti), chromium (Cr), or the like, providing characteristics that allowed tuning of a plasmon resonance to a higher order mode (typically the first order above the fundamental mode) of the laser to help suppress higher order modes of the laser.

The second layer 114*b* is preferably gold (Au) and positioned on top of the first layer 114*a*, which assists defining the resonant structure of the metallization layer 114*a* and serves as a path of electron injection into the core 102. In other embodiments of the invention, the second layer 114*b* may be silver (Ag), aluminum (Al), or other plasmonic materials. The substrate 110 may be heavily doped and serve as the companion electrode to the second layer 114*b*

Surface plasmon modes are confined mainly to the first and second metallization layer 114*a*, 114*b*. The layers 114*a*, 114*b* are positioned to interact with the optical field of the central ridge 101 and the core 102 and to couple energy from the first HO mode and through its high loss mechanism dissipate energy from the HO mode. This in turn increases the threshold gain for the HO modes effectively suppressing the HO modes.

Figures 3, 4:
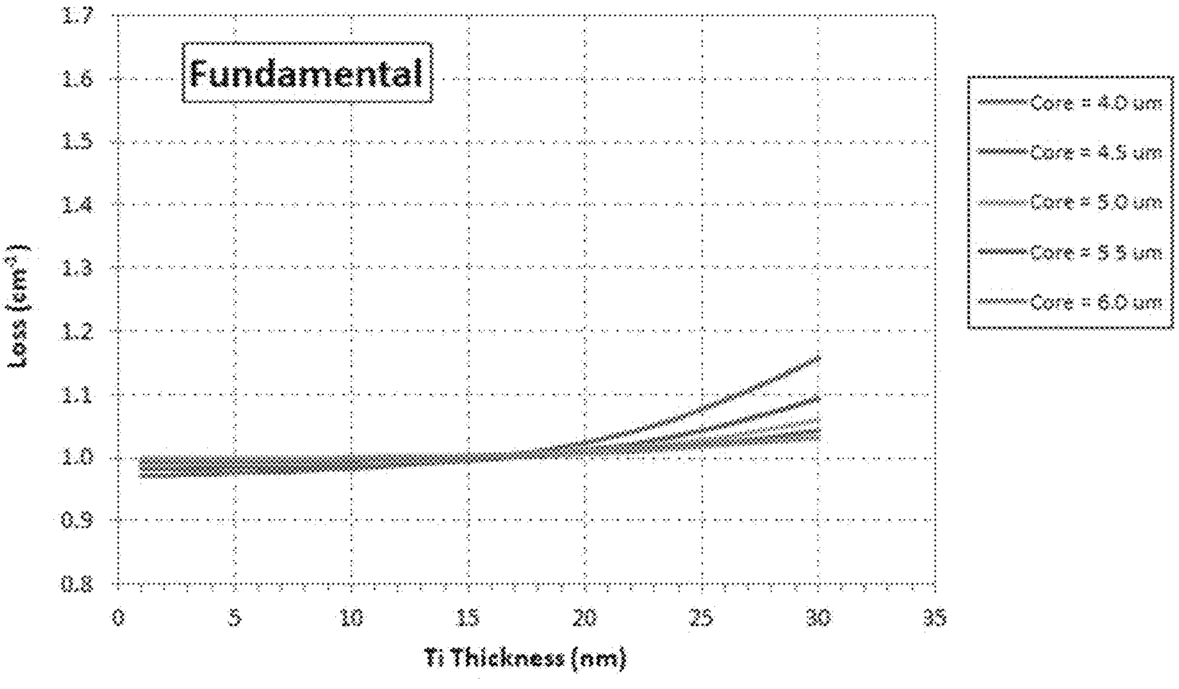
FIG. 3 is a graph depicting the losses of the fundamental mode of the waveguide structure of FIGS. 2A and 2B.
FIG. 4 is a graph depicting the losses of the first HO mode of the waveguide structure of FIGS. 2A and 2B.

Next, FIG. 3 provides a graphical representation of the loss of the fundamental mode of the structure 100 of FIG. 2. In particular, the first layer 114*a* of the metallization layer 114 of the structure 100 is Ti and may range in thickness from 1 nm to 30 nm. More specifically, FIG. 3 depicts the loss of the fundamental mode as a function of the thickness of the first layer 114*a* for several different widths of the core 102. Similarly, FIG. 4 is a graphical representation of the loss of the first HO mode as a function of the thickness of the first layer 114*a*. It is shown that as the core width increase, the peak of the HO mode loss decreases. It can be seen that for certain values of the Ti thickness of the first layer 114*a*, the loss increases dramatically. For example, when the core width is 4.5 with a first layer 114*a* thickness of 5 nm, the loss of the HO mode exceeds 20 $cm^{-1}$. As the core width increases, the peak of the HO mode loss decreases. However, even with a core width of 5.0 the peak loss is still well above the loss of the fundamental mode, as shown in FIG. 3. As shown in the graphical representations of FIGS. 3 and 4, the preferable thickness of the first layer 114*a* may range from 1.0 nm to 6.0 nm, and the preferably width of the core may range from 4.0 μm to 6.0 μm. The graphical representations of FIGS. 3 and 4 represent theoretical models of the structure 100.

Figure 5:
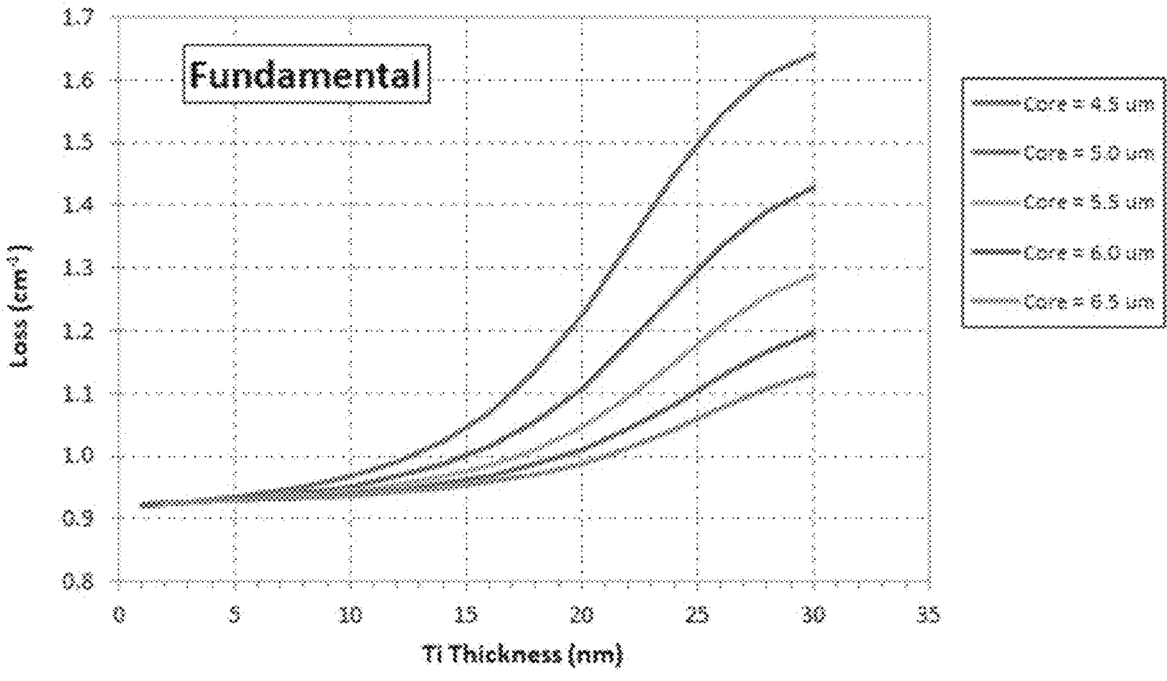
FIG. 5 is a graph depicting the losses of the fundamental mode of a modified version of the waveguide structure of FIGS. 2A and 2B.
Figure 6:
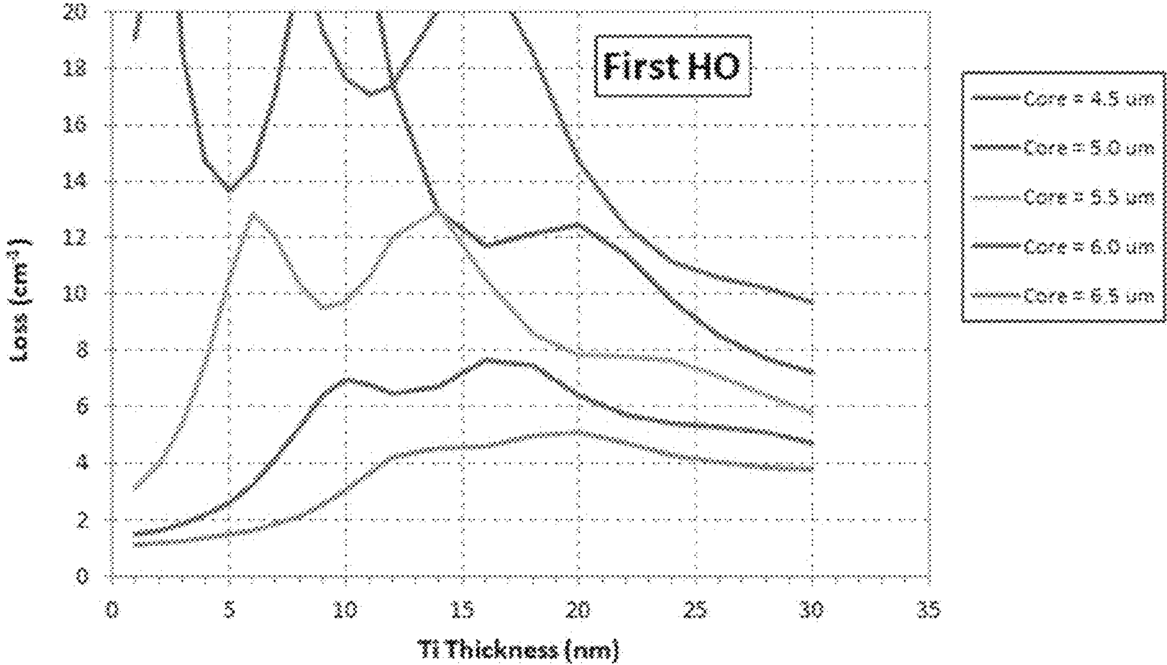
FIG. 6 is a graph depicting the losses of the first HO mode of the modified version of the waveguide structure of FIGS. 2A and 2B.

Next, FIG. 5 shows the graphical representation of the loss of the fundament mode of a modified version of the structure 100 of FIG. 2 as a function of the thickness of an equivalent first layer 114*a* for several values of core width. Similarly, FIG. 6 shows the graphical representation of the loss of first HO mode of the modified structure as a function of thickness of the equivalent first layer 114*a* for several values of core width. In particular, the modified structure does not include the InGaAs layers 102*b* of the structure 100. As described above, the InGaAs layers 102*b* enhance the confinement of the optical field to the core 102 and reduce the interaction between the optical field and the metallization layer 114. The graphical representations of FIGS. 5 and 6 represent theoretical models of the above-described modified version of the structure 100.

Without the InGaAs layers 102*b*, the optical field has greater interaction with the metallization layer 114 of the modified waveguide. As a result, the loss of the fundamental mode increases sharply as the thickness of the first layer 114*a* increases above 15 nm. Meanwhile, for first layer 114*a* thicknesses between 5 and 12 nm, where in the loss of the fundamental mode is small (e.g., <1 $cm^{-1}$), the first HO mode loss is very large for core widths up to 6.0 μm. This loss is caused by the large enhancement of the first HO mode field in the region adjacent to the metallization layer 114.

Figure 7:
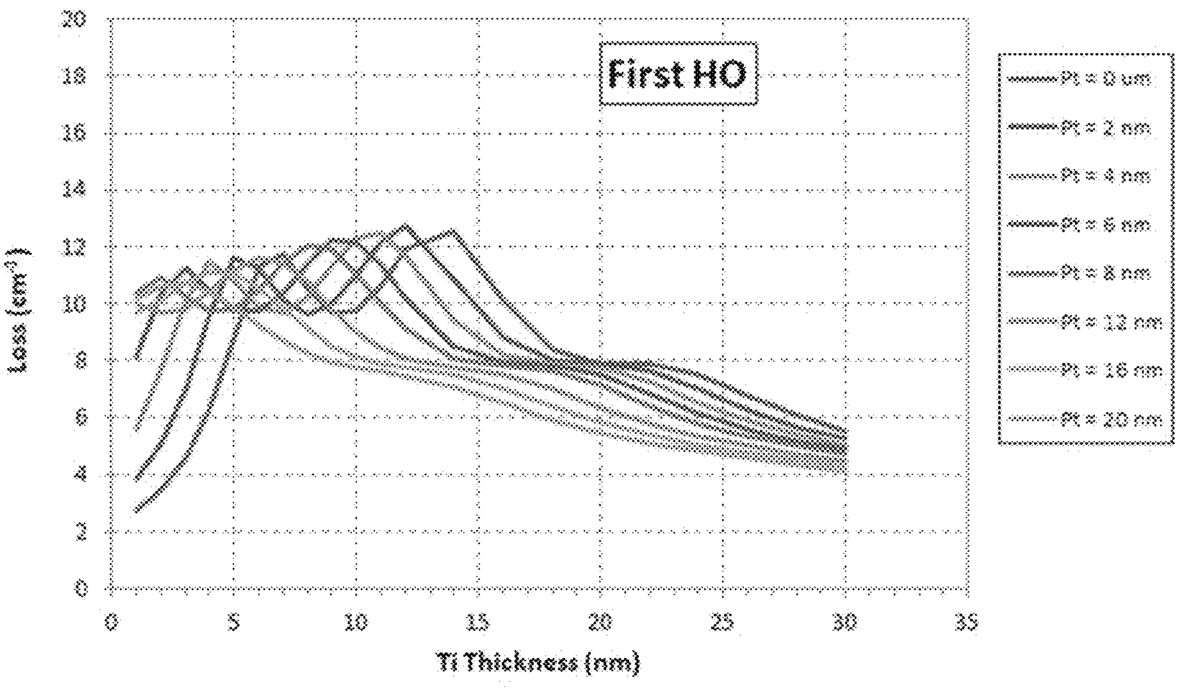
FIG. 7 is a graph depicting the losses of the first HO mode of another modified version of the waveguide structure of FIGS. 2A and 2B.

Next, FIG. 7 illustrates the graphical representation of the loss of the first HO mode of another modified version of the structure 100 of FIG. 2 as a function of the thickness of an equivalent first layer 114*a* for several values of core width. In this instance, the modified version of the structure 100 once again includes the InGaAs layers 102*b* but also includes the addition of a third layer of the metallization layer 114. More specifically, the addition of a platinum (Pt) layer between the Ti layer 114*a* and the Au layer 114*b*. Preferably, the thickness of the Pt layer ranges from 1 nm to 20 nm. Further, FIG. 7 represents a structure 100 with a core width of 4.5 μm. It should be noted that the Pt layer had minimal to no effect on the losses of the fundamental mode when compared to FIG. 3. As shown in FIG. 7, while the addition of the Pt layer decreases the peak in the losses of the first HO mode, the difference between the losses of the fundamental mode and the first HO mode is still significant enough to result in lasing of only the fundamental mode over a wide range of thickness of the Ti layer 114*a* for thicknesses of the Pt layer up to about 8 nm. The graphical representations of FIG. 7 represent theoretical models of the above-described modified version of the structure 100.

Figure 8:
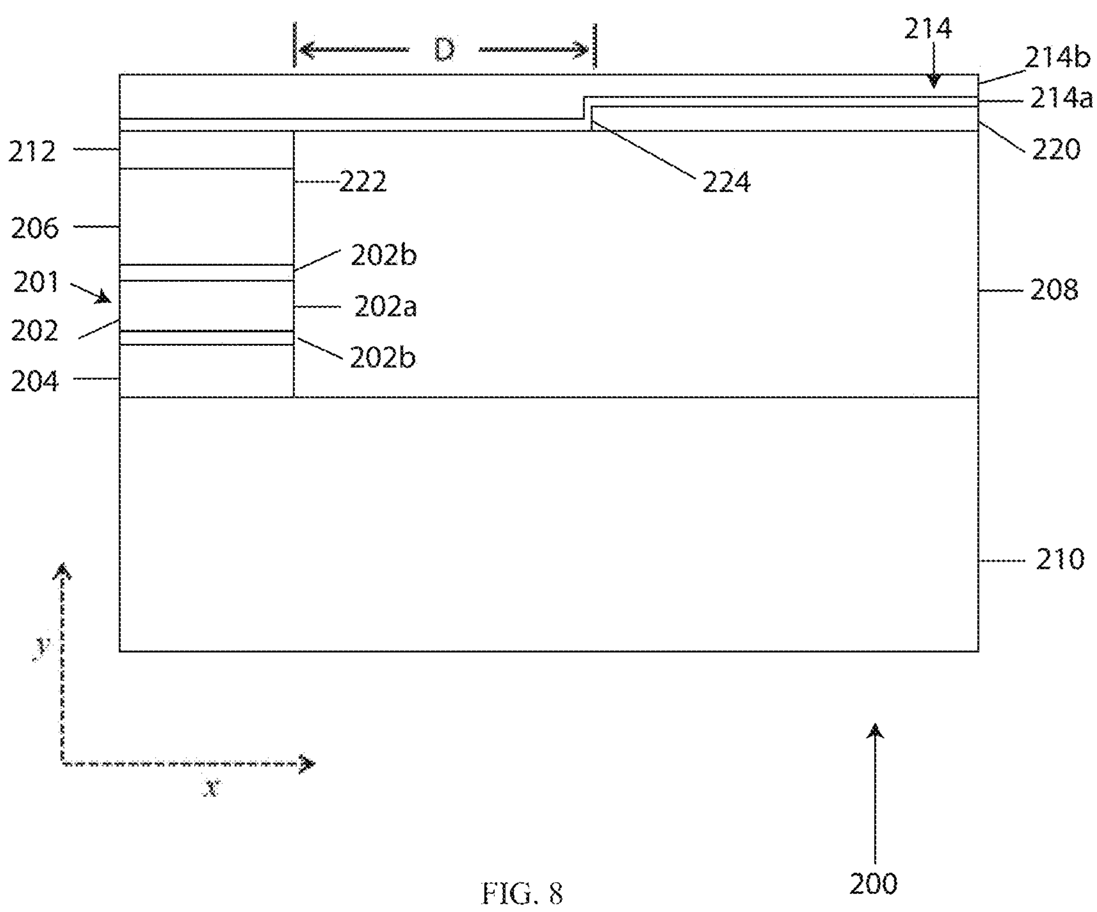
FIG. 8 is a waveguide structure of a semiconductor laser, according to another embodiment of the invention.

Now referring to FIG. 8, a structure 200 of a semiconductor laser is shown according to another embodiment of the invention. Structure 200 is similar to previously discussed structure 100. Once again, the layer thicknesses of the structure 200 of FIG. 8 are not drawn to scale. Further, FIG. 8 only illustrates the right half of the structure 200 (x>0). The structure 200 is symmetrical in the x-coordinate (refer to FIGS. 2A and 2B regarding the concept of mirroring about the x-coordinate). The below described doping layers are preferably doped with silicon unless otherwise stated. Further, the level of doping (i.e., 2E16, 2E18, etc.) refers to the doping per $cm^3$.

The structure 200 includes a central ridge 201 including an active core 202 having a main core region 202*a* and an indium gallium arsenide (InGaAs) layer 202*b* disposed on either or both of the top and bottom sides of the active core region 202*a*. The central ridge 101 also includes a lower confinement or cladding layer 204 and an upper confinement or cladding layer 206. Confinement layer 204 is disposed below the core 202 and between the core 202 and a semiconductor substrate 210. In the preferred embodiment of the invention, the lower confinement layer 204 is an InP doped layer. More preferably, the lower confinement layer 204 is an InP (2E16) doped layer.

Confinement layer 206 is disposed above the core 202 and may also be referred to as an upper confinement layer 206. In the preferred embodiment of the invention, the upper confinement layer 206 is an InP doped layer. More preferably, the upper confinement layer 206 is an InP (2E16) doped layer. In the representative embodiment of the invention, the upper confinement layer 206 may include a cap layer 212 disposed at the upper portion of the upper confinement layer 206 and adjacent a metallization layer 214. Preferably, the cap layer 212 is also an InP doped layer. More preferably, the cap layer 212 is an InP (2E19) doped layer. The cap layer 212 has a lower index than the rest of the upper confinement layer 206 to prevent interaction between the metallization layer 214 and the field above the core 202. The doping level and thickness of the cap layer 212 may be adjusted to increase the loss of the first HO mode.

The above-described central ridge 201 and core 202 are then buried by a confinement or cladding layer 208 disposed on either side of the core 202 and extending from the substrate 210 to the cap layer 212 at the metallization layer 214. In the representative embodiment of the invention, the confinement layer 208 extends from the side of the core 202 to the end of the substrate 210 and may be referred to as the side confinement layer 208. Preferably, the side confinement layer 208 is an Fe:InP doped layer that confines the light and current to the core 202 and the active core region 202*a*.

A substantial difference between the structure 100 of FIG. 2—and its variants discussed above—and the structure 200 of FIG. 8 is the inclusion of an insulating layer 220. The insulating layer 220 is disposed between the metallization layer 214 and the side confinement layer 208 along a portion of the side confinement layer 208 less than the entire side confinement layer 208. As shown in FIG. 8, the insulating layer 220 is displaced from a first edge 222 of the side confinement layer 208 adjacent the upper confinement layer 206 by a distance D. In the present invention, D>0. Conversely, in the prior art and as shown in FIG. 1, the insulating layer 16 extends beyond the edge of the confinement layer 12. That is, in the prior art D<0. In a preferred embodiment of the invention, the insulating layer 220 may be silicon nitride ($Si_3N_4$) or silicon dioxide ($SiO_2$).

Similar to structure 100, structure 200 includes two metallization layers 214*a* and 214*b* disposed above the upper and side confinement layers 206, 208. In the representative embodiment of the invention, the first layer 214*a* is disposed directly on the upper surface of the upper confinement layer 206 and a portion of the upper surface of the side confinement layers 208. Meanwhile, the second layer 214*b* is disposed directly on the upper surface of the first layer 214*a*.

In this embodiment of the invention, the first layer 214*a* of the metallization layer 214 is in direct contact with the entire upper confinement layer 206 over the core 202 and a portion less than the entire side confinement layer 208. The portion of the side confinement layer 208 in direct contact with the first metallization layer 214*a* extends from the first edge 222 of the side confinement layer 208 adjacent the upper confinement layer 206 for a distance D to a location 224 spaced apart from the end of the side confinement layer 208 and the structure 200.

Preferably, the first layer 214*a* may be titanium (Ti), chromium (Cr), or the like, providing characteristics that allow tuning of a plasmon resonance to a HO mode—typically the first order above the fundamental mode—of the laser to help suppress HO modes of the laser.

The second layer 214*b* is preferably gold (Au) and positioned on top of the first layer 214*a*, which assists defining the resonant structure of the first metallization layer 214*a* and serves as a path of electron injection into the core 202. In other embodiments of the invention, the second layer 214*b* may be silver (Ag), aluminum (Al), or other plasmonic materials. The substrate 210 is heavily doped and serves as the companion electrode to the second layer 214*b*.

Surface plasmon modes are confined mainly to the first and second metallization layers 214*a*, 214*b*. The layers 214*a*, 214*b* are positioned to interact with the optical field of the central ridge 201 and the core 202 and to couple energy from the first HO mode and through its high loss mechanism dissipate energy from the HO mode. This in turn increases the threshold gain for the HO modes effectively suppressing the HO modes.

Figure 9:
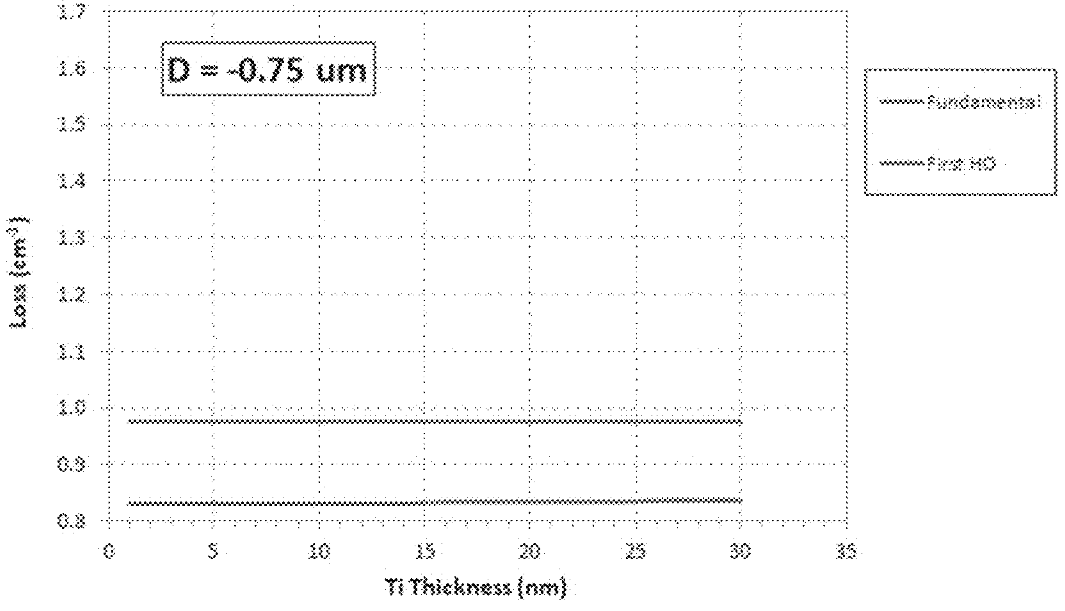
FIG. 9 is a graph depicting the losses of the fundamental mode and the first HO mode of the waveguide structure of FIG. 1.

FIG. 9 provides graphical representation of the losses of the fundamental mode and the first HO mode of a structure having an offset distance D<0, in accordance with the prior art (i.e., FIG. 1). In particular, the offset distance of D is −0.75 μm. The graphical representation of FIG. 9 represents a theoretical model of such a structure.

Figure 10:
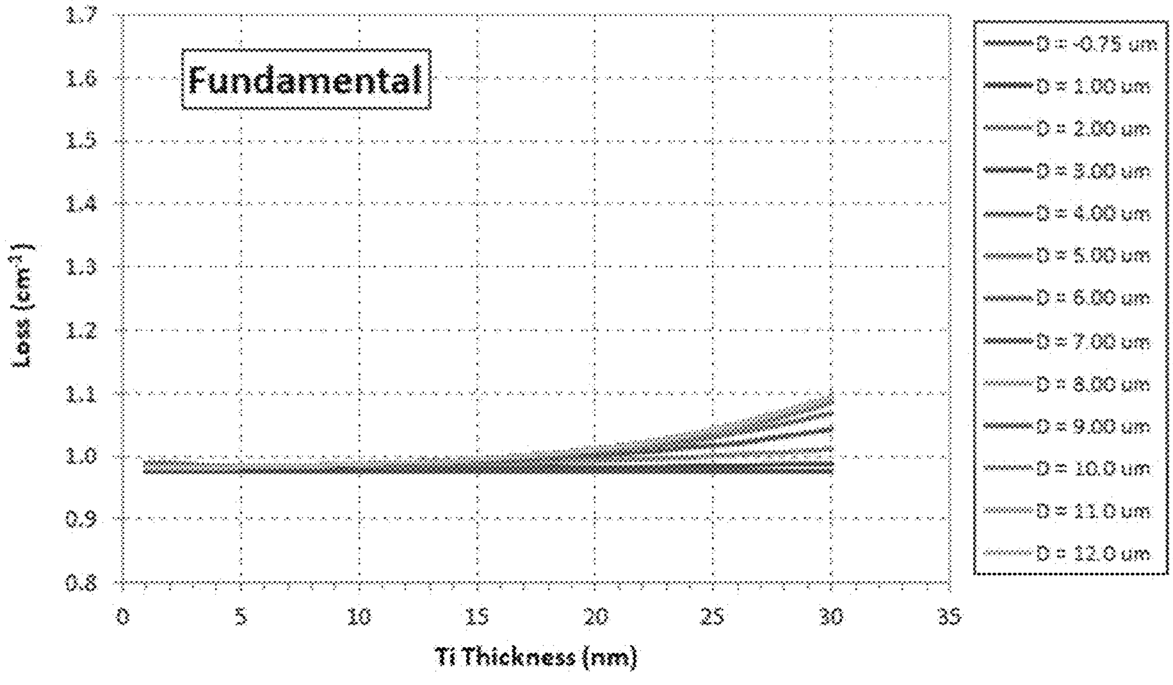
FIG. 10 is a graph depicting the losses of the fundamental mode of the waveguide structure of FIG. 8.
Figure 11:
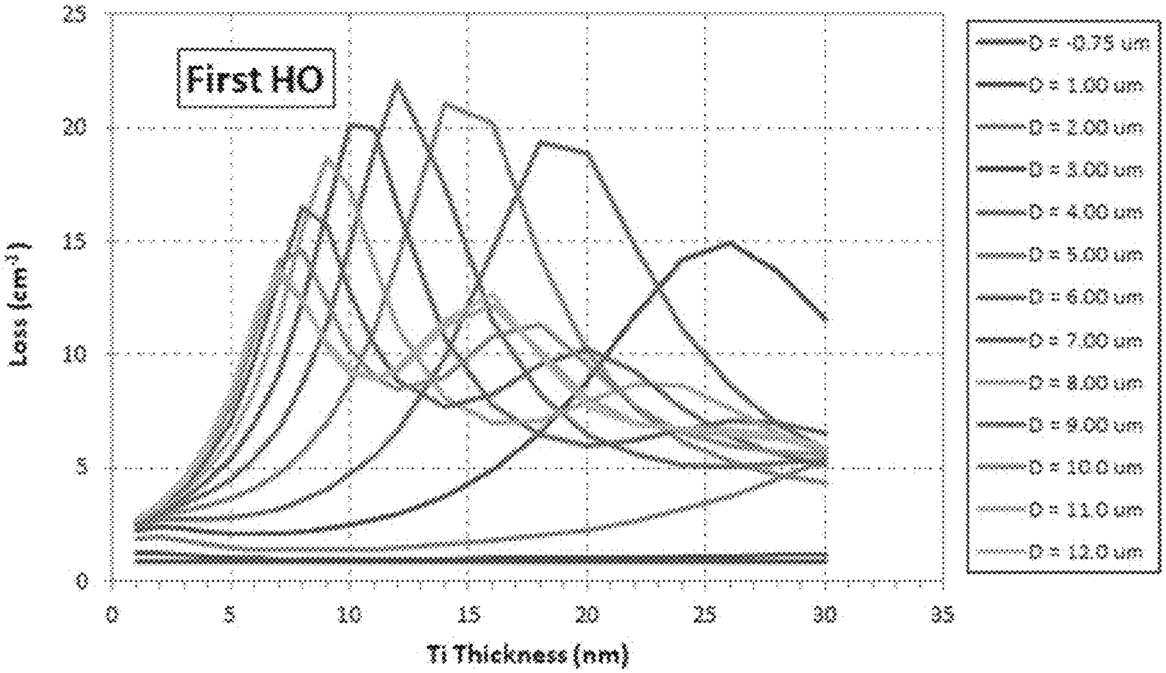
FIG. 11 is a graph depicting the losses of the first HO mode of the waveguide structure of FIG. 8.

Conversely, FIGS. 10 and 11 provide graphical representation of the loss of the fundamental mode and the first HO mode, respectively, of the structure 200 of FIG. 8. In particular, the first metallization layer 214*a* of the structure 200 is Ti and may range in thickness from 1 nm to 30 nm. More specifically, FIGS. 10 and 11 depict the loss of the fundamental mode and the first HO mode as a function of the thickness of the first layer 214*a* for several different offset distances D of the insulating layer 220. For the purposes of FIGS. 9 and 10, the insulating layer 220 is in the form of silicon nitride. The graphical representations of FIGS. 10 and 11 represent theoretical models of the structure 200.

In contrast to the fundamental mode, the first HO mode shows dependence on both the thickness of the first metallization layer 214*a* and the offset distance D of the insulating layer 220. In particular, for offset distances D between 5 μm and 9 μm in combination with first metallization layer 214*a* thicknesses between 5 μm and 15 μm, the loss of the first HO mode can be greatly enhanced with almost no change to the corresponding loss of the fundamental mode. As such, the distance D may be tuned to optimize the loss of the first HO mode.

Figures 12, 13:
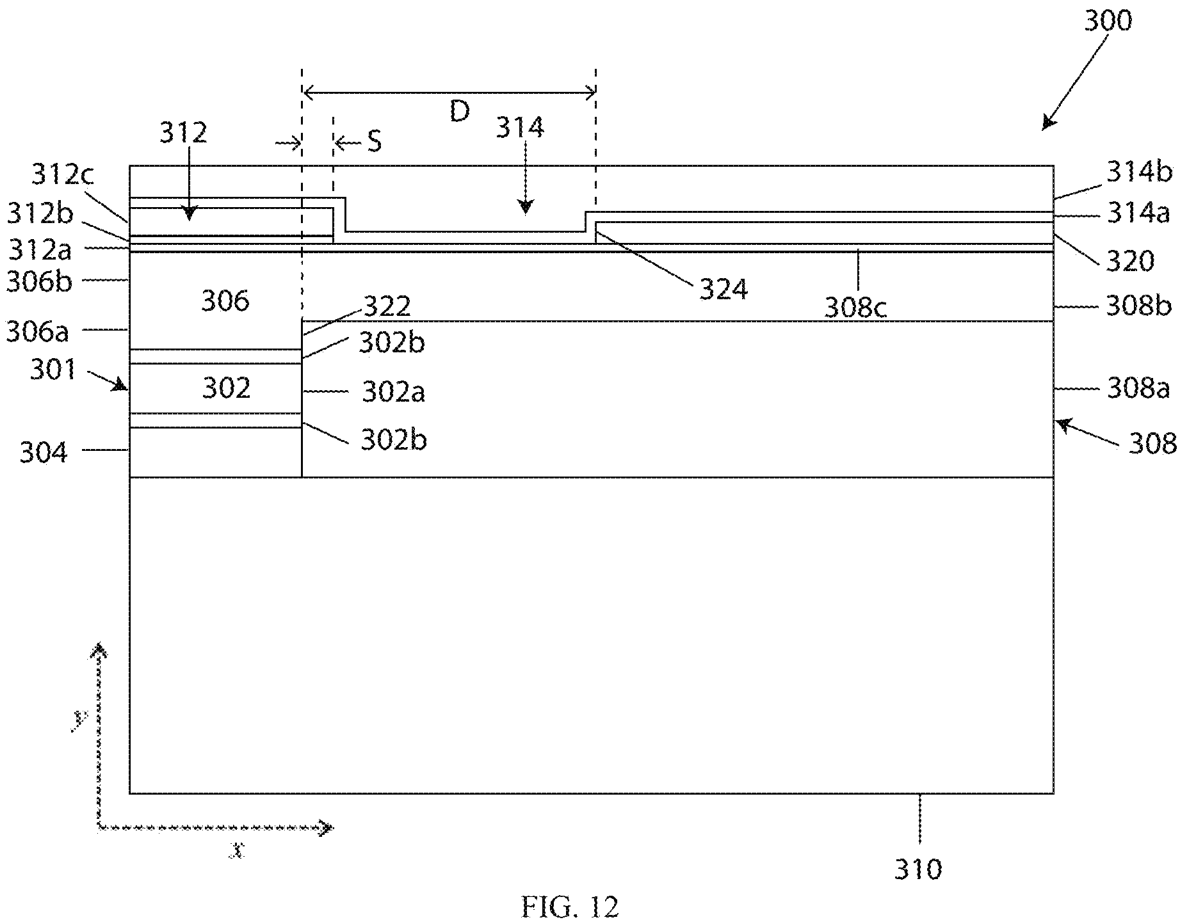
FIG. 12 is a waveguide structure of a semiconductor laser, according to another embodiment of the invention.
FIG. 13 is a graph depicting the losses of the fundamental mode and the first HO mode of the waveguide structure of FIG. 12.

Next, FIG. 12 illustrates a structure 300 of a semiconductor laser according to another embodiment of the invention. As with FIGS. 2 and 8, the layer thicknesses of the structure 300 of FIG. 12 are not shown to scale. Further, FIG. 12 only shows the right half of the structure 300 (x>0). The structure 300 is symmetrical in the x-coordinate (refer to FIGS. 2A and 2B regarding the concept of mirroring about the x-coordinate). The below described doping layers are preferably doped with silicon unless otherwise stated. Further, the level of doping (i.e., 2E16, 2E18, 8E18, etc.) refers to the doping per $cm^3$.

The structure 300 includes a central ridge 301 having an active core 302 with a main core region 302*a* and an indium gallium arsenide (InGaAs) layer 302*b* disposed on either or both of the top and bottom sides of the active core region 302*a*. The central ridge 301 also includes an upper confinement or cladding layer 304 and a lower confinement or cladding layer 306. The lower confinement layer 304 is disposed below the core 302 and between the core 203 and a semiconductor substrate 310. Preferably, the lower confinement layer 304 is an InP doped layer. More preferably, the lower confinement layer 304 is an InP (2E16) doped layer. Meanwhile, the upper confinement layer 306 is disposed above the core 302. In the preferred embodiment of the invention, the upper confinement layer 306 is an InP doped layer. More preferably, the upper confinement layer 306 is an InP (2E16) doped layer.

The above-described central ridge 301 and core 302 are then buried by a side confinement or cladding layer 308. Preferably, the side confinement layer 308 is an Fe:InP doped layer that confines the light and current to the core 302 and the active core region 302*a*.

In this representative embodiment of the invention, additional confinement or cladding layers are deposited or grown on to extend the upper and side confinement layers 306, 308. In particular, the upper confinement layer 306 may include the original first upper confinement layer 306*a* of the central ridge 301 and an additional second upper confinement layer 306*b* disposed on top of the first upper confinement layer 306*a*. Preferably, the second upper confinement layer 306*b* may also be an InP doped layer. More preferably, the second upper confinement layer 306*b* may also be an InP (2E16) doped layer. Similarly, the side confinement layer 308 may include the original first side confinement layer 308*a* and an additional second side confinement layer 308*b* disposed on top of the first side confinement layer 308*a*. Preferably, the second side confinement layer 308*b* is an InP doped layer. More preferably, the second side confinement layer 308*b* is an InP (2E16) doped layer. In the preferred embodiment of the invention, the second upper confinement layer 306*b* and the second side confinement layer 308*b* are applied to the structure 300 at the same time and have the same level of doping.

Next, a cap layer is added to extend the upper and side confinements layers 306, 308. As shown in FIG. 12, the upper confinement layer 306 may include a cap layer 312 disposed on the second upper confinement layer 306*b*. Preferably the cap layer 312 of the upper confinement layer 306 is also an InP doped layer. More preferably, the cap layer 312 may be an InP (8E18) doped layer. Similarly, the side confinement layer 304 may include a cap layer 308*c* disposed on the second side confinement layer 308*b*. Preferably, the cap layer 308*c* of the side confinement layer 308 is also an InP doped layer. More preferably, the cap layer 308*c* may be an InP (8E18) doped layer. In the preferred embodiment of the invention the cap layers 312, 308*c* are applied to the structure 300 at the same time and have the same level of doping. The doping level and thickness of the cap layers 312, 308*c* may be adjusted to increase the loss of the first HO mode.

As shown in FIG. 12, the cap layer 312 includes a lower portion 312*a*, an etch stop layer 312*b*, and an upper portion 312*c*. Preferably, the thickness of the lower portion 312*a* is consistent with the thickness of the cap layer 308*c* of the side confinement layer 308. In particular, the cap layers 312, 308*c* may be disposed on the upper and side confinement layers 304, 308 at the thickness of the entire cap layer 312 (i.e., including the lower portion 312*a*, the etch stop layer 312*b*, and the upper portion 312*c*). Then, the thickness of the cap layer 308*c* is reduced by etching away an equivalent of the upper portion 312*c* and the etch stop layer 312*b*. The etch stop layer 312*b* is configured to provide an indicator of when to stop etching in order to achieve a proper thickness of the cap layer 308*c*. The thickness of the cap layer 308*c* may be tuned to optimize the losses of the first HO mode and suppress the HO modes of the laser. This results in a two-step process for creating the buried structure 300.

FIG. 12 further illustrates an overhang S of the cap layer 312. In turn, the cap layer 312, and more specifically its upper portion 312*c* and etch stop 312*b*, extend beyond the central ridge 301 and onto the side confinement layer 308 for a distance S. In the preferred embodiment of the invention, the distance S may be 0.5 μm to ensure overhang of the cap layer 312 beyond the central ridge 301.

Next, the structure 300 may include an insulating layer 320 disposed between a metallization layer 314 and the side confinement layer 308, more specifically the cap layer 308*c* of the side confinement layer 308, along a portion of the side confinement layer 308 less than the entire side confinement layer 308. As shown in FIG. 12, the insulating layer 320 is displaced from a first edge 322 of the side confinement layer 308 by a distance D. In the present invention, D>0. Conversely, in the prior art and as shown in FIG. 1, the insulating layer 16 extends beyond the edge of the confinement layer 12. That is, in the prior art D<0. In a preferred embodiment of the invention, the insulating layer 320 may be silicon nitride ($Si_3N_4$) or silicon dioxide ($SiO_2$). The distance D may be optimized to increase the losses of the HO mode and suppress HO modes of the laser.

Similar to the previously discussed embodiments of the invention, structure 300 includes a metallization layer 314 including at least two metallization layers 314*a*, 314*b*. In this instance, the first metallization layer 314*a* is in direct contact with the cap layer 312 of the upper confinement layer 306 over the core 302 and a portion less than the entirety of the cap layer 308*c* of the side confinement layer 308. The portion of the side confinement layer 308 In direct contact with the first metallization layer 314*a* extends to a location 324 spaced apart from the first edge 322 of the side confinement layer 308 by the distance D discussed above.

Preferably, the first layer 314*a* may be titanium (Ti), chromium (Cr), or the like, providing characteristics that allow tuning of a plasmon resonance in the first layer 214*a* to a HO mode—typically the first order above the fundamental mode—of the laser to help suppress HO modes of the laser.

The second layer 314*b* is preferably gold (Au) or Platinum (Pt) and positioned on top of the first layer 314*a*, which assists defining the resonant structure of the first metallization layer 314*a* and serves as a path of electron injection into the core 302. In other embodiments of the invention, the second layer 314*b* may be silver (Ag), aluminum (Al), or other plasmonic materials. The substrate 310 is heavily doped and serves as the companion electrode to the second layer 314*b*.

Surface plasmon modes are confined mainly to the first and second metallization layers 314*a*, 314*b*. The layers 314*a*, 314*b* are positioned to interact with the optical field of the central ridge 301 and the core 302 and to couple energy from the first HO mode and through its high loss mechanism dissipate energy from the HO mode. This in turn increases the threshold gain for the HO modes effectively suppressing the HO modes.

Referring now to FIG. 13, a graphical representation of the losses of the fundamental mode and the first HO mode. More specifically, FIG. 13 depicts the loss of the fundamental mode and the first HO mode as a function of the offset distances D of the insulating layer 320. For the purposes of FIG. 13, the first metallization layer 314*a* of the structure 300 is Ti and has a thickness of 10 nm. Further, width of the central ridge 301 is 5.5 μm and the overhang distance S is 0.5 μm. In addition, the insulating layer 220 is in the form of silicon nitride. As shown in FIG. 13, the distance D may be tuned to optimize the loss of the first HO mode.

Not shown in the drawings, a semiconductor laser (e.g., QCL) using the optical waveguide structures 100, 200, 300 or their alternatives described above would further include a first facet disposed on the back side of the wavelength structure along the z-axis of the provided drawings and a second facet disposed on the front side of the optical waveguide structure along the z-axis of the provided drawings. Further yet, a first dielectric passivation layer may be disposed between the first facet and the backside of the wavelength structure. The first dielectric passivation layer may include a thin layer of Au. In addition, a second dielectric passivation layer may be disposed between the second facet and the front side of the wavelength structure. That is, the output of the semiconductor laser is along the z-axis of the shown figures.

Due to the arrangement of the structures 100, 200, 300 of the present invention and their described variants, the metallization layers 114, 214, 314 may also be referred to as electron injection layers. Meanwhile, the substrates 110, 210, 310 may also be referred to as electron collectors or electron collecting layers.

The above exemplary embodiments of the invention demonstrate that it is possible to enhance the loss of the first HO mode without significantly affecting the loss of the fundamental mode. This loss enhancement is caused by a large increase in the amplitude of the first HO mode field in the region adjacent the metallization layers 114, 214, 314. In particular, the loss enhancement of the first HO mode field in the region adjacent the metallization layers 114, 214, 314 may be increased by anywhere from 300% to 2000% or greater based on the tuning of the metallization layers 114, 214, 314, the location of the insulating layer 220, 320, and/or the properties (i.e., thickness and doping) of the cap layer 112, 212, 312, 308*c*. The first HO mode becomes a hybrid between a pure core mode and a surface plasmon mode. As a result, enhanced beam quality can be achieved while maintaining a core width greater than 4 μm.

It is specifically intended that the present invention not be limited to the embodiments and illustrations contained herein, but includes modified forms of those embodiments including portions of the embodiments and combinations of elements of different embodiments as come within the scope of the following claims.

What is claimed is:

1. A semiconductor laser structure comprising:
- a core including an active core region adapted to provide a laser output having a fundamental mode;
- a plurality of confinement layers disposed around the core, the plurality of confinement layers including:
  - a first confinement layer disposed between the core and a substrate below the core;
  - a second confinement layer disposed above the core; and
  - a third confinement layer disposed along at least one side of the core;
- a plurality of metallization layers disposed above the second confinement layer and the third confinement layer, the plurality of metallization layers including:
  - a first metallization layer in direct contact with the second confinement layer and the third confinement layer, the first metallization layer tuned to have a plasmon resonance in the metallization layers corresponding to a higher order mode; and
- further comprising an insulating layer disposed between the metallization layer and the third confinement layer for a first portion of the third confinement layer wherein the first metallization layer is in direct contact with a second portion of the third confinement layer adjacent the second confinement layer; and
- wherein the second portion of the third confinement layer extends from the second confinement layer for a distance to a predisposed location; and wherein the first portion of the third confinement layer extends from the predisposed location to an end of the third confinement layer.

2. The semiconductor laser structure of claim 1 wherein the distance is tuned to optimize the loss of a higher order mode.

3. The semiconductor laser structure of claim 1 wherein the core includes at least one InGaAs layer disposed on at least one side of the active core region.

4. The semiconductor laser structure of claim 1 wherein the plurality of metallization layers further includes a third metallization layer disposed between the first and second metallization layers.

5. The semiconductor laser structure of claim 4 wherein the third metallization layer comprises platinum.

6. The semiconductor laser structure of claim 1 wherein a width of the core is greater than 4 μm.

7. The semiconductor laser structure of claim 1 wherein the second confinement layer includes a cap layer disposed at an upper portion thereof.

8. The semiconductor laser structure of claim 7 wherein the cap layer includes an overhang.

9. The semiconductor laser structure of claim 1 wherein the first metallization layer comprises one of titanium or chromium.

10. The semiconductor laser structure of claim 1 wherein the second metallization layer comprises a plasmonic material.

11. The semiconductor laser structure of claim 1 wherein the second metallization layer comprises gold.

12. The semiconductor laser structure of claim 1 wherein the distance is greater than 4 μm.

13. The semiconductor laser structure of claim 1 wherein the distance is less than 6 μm.

14. The semiconductor laser structure of claim 1 wherein the distance is greater than 4 μm and less than 6 μm.

15. The semiconductor laser structure of claim 1 wherein the first metallization layer has a thickness greater than 10 nm.

16. The semiconductor laser structure of claim 1 wherein the first metallization layer has a thickness less than 22 nm.

17. The semiconductor laser structure of claim 1 wherein the first metallization layer has a thickness greater than 10 nm and less than 22 nm.

18. The semiconductor laser structure of claim 1 wherein the distance is greater than 4 μm and less than 6 μm, and wherein the first metallization layer has a thickness greater than 10 nm and less than 22 nm.

19. A method of using a semiconductor laser structure comprising:

providing a semiconductor structure comprising:

a core including an active core region adapted to provide a laser output having a fundamental mode;

a plurality of confinement layers disposed around the core, the plurality of confinement layers including:

a first confinement layer disposed between the core and a substrate below the core;

a second confinement layer disposed above the core; and a third confinement layer disposed along at least one side of the core;

a plurality of metallization layers disposed above the second confinement layer and the third confinement layer, the plurality of metallization layers including:

a first metallization layer in direct contact with the second confinement layer and the third confinement layer, the first metallization layer tuned to have a plasmon resonance corresponding to a higher order mode; and a second metallization layer disposed above the first layer;

further comprising an insulating layer disposed between the metallization layer and the third confinement layer for a first portion of the third confinement layer wherein the first metallization layer is in direct contact with a second portion of the third confinement layer adjacent the second confinement layer;

wherein the second portion of the third confinement layer extends from the second confinement layer for a distance to a predisposed location; and wherein the first portion of the third confinement layer extends from the predisposed location to an end of the third confinement layer; and applying a voltage across the substrate and the first metallization layer to inject electrons into the core.

20. The method of claim 19 wherein the second confinement layer may include a cap layer having a thickness tuned to have plasmon resonance corresponding to the higher order mode.

21. The method of claim 19 wherein the cap layer includes an overhang.

22. The method of claim 19 further comprising tuning the distance to optimize the loss of a higher order mode.

23. The method of claim 19 wherein the second metallization layer comprises a plasmonic material.

24. The method of claim 19 wherein the plurality of metallization layers further includes a third metallization layer disposed between the first and second metallization layers.

* * * * *